US010782356B2

(12) United States Patent
Yannam et al.

(10) Patent No.: US 10,782,356 B2
(45) Date of Patent: Sep. 22, 2020

(54) SYSTEMS AND METHODS FOR MONITORING LEAKAGE CURRENT OF AN INDUSTRIAL MACHINE

(71) Applicant: General Electric Company, Schenectady, NY (US)

(72) Inventors: Ashok Kumar Yannam, Minden, NV (US); Duane Thomas Winter, Gardnerville, NV (US); Robert Ronald Nikkels, Gardnerville, NV (US); Dan Tho Lu, Minden, NV (US); Robert Paul Stachow, Carson City, NV (US)

(73) Assignee: BAKER HUGHES, A GE COMPANY, LLC, Houston, TX (US)

( * ) Notice: Subject to any disclaimer, the term of this patent is extended or adjusted under 35 U.S.C. 154(b) by 637 days.

(21) Appl. No.: 14/073,727

(22) Filed: Nov. 6, 2013

(65) Prior Publication Data

US 2015/0123671 A1    May 7, 2015

(51) Int. Cl.
*G01R 31/02*    (2006.01)
*G01M 99/00*    (2011.01)
*G01R 31/50*    (2020.01)
*G01R 31/34*    (2020.01)
*H02P 29/024*   (2016.01)

(52) U.S. Cl.
CPC .......... *G01R 31/50* (2020.01); *G01M 99/005* (2013.01); *G01R 31/343* (2013.01); *H02P 29/0241* (2016.02)

(58) Field of Classification Search
CPC .... G01R 31/025; G01R 31/34; G01R 31/343; G01R 31/346; G01R 31/1227; G01R 19/25; G01R 21/133; G01R 31/50; G01M 99/005; H02P 29/021; H02P 29/022;
(Continued)

(56) References Cited

U.S. PATENT DOCUMENTS

| 4,783,748 A | * | 11/1988 | Swarztrauber | ....... G01R 21/133 324/142 |
| 5,514,978 A | * | 5/1996 | Koegl | .................. G01R 31/346 318/690 |

(Continued)

OTHER PUBLICATIONS

Stator Insulation Monitoring System, "Bently Nevada Stator Insulation Monitoring System," General Electric Company manual, Sep. 2013, 13 pages.

(Continued)

*Primary Examiner* — Lee E Rodak
(74) *Attorney, Agent, or Firm* — Mintz Levin Cohn Ferris Glovsky and Popeo, P.C.

(57) ABSTRACT

A system includes a plurality of sensors configured to detect an electrical voltage and an electrical leakage current associated with an operation of an industrial machine, and a controller including a processor and a selection device. The selection device is configured to receive from the plurality of sensors a first input corresponding to the electrical voltage, and a second input corresponding to the electrical leakage current. The first input is paired with the second input to generate a paired input. The selection device is configured to transmit an output to the processor based at least in part on the paired input. The output includes an indication of the electrical leakage current or a dissipation factor associated with the industrial machine.

6 Claims, 4 Drawing Sheets (58) Field of Classification Search
CPC ...... H02P 29/0241; H02P 21/16; H01F 38/28; H02J 3/38
USPC ... 324/511, 509, 510, 512, 545–546, 765.01, 324/177
See application file for complete search history.

(56) References Cited

U.S. PATENT DOCUMENTS

| | | | | |
|---|---|---|---|---|
| 5,521,482 | A * | 5/1996 | Lang | G01R 31/343 318/800 |
| 6,236,947 | B1 * | 5/2001 | Dowling | G01R 31/343 324/750.16 |
| 6,618,684 | B1 * | 9/2003 | Beroset | G01R 11/185 702/99 |
| 6,815,942 | B2 * | 11/2004 | Randall | G01R 35/04 324/142 |
| 8,217,644 | B2 | 7/2012 | Younsi et al. | |
| 2003/0151415 | A1 * | 8/2003 | Randall | G01R 35/04 324/601 |
| 2005/0218906 | A1 * | 10/2005 | Younsi | G01R 31/346 324/551 |
| 2008/0186013 | A1 * | 8/2008 | Rzehak | G01R 22/10 324/107 |
| 2010/0194323 | A1 * | 8/2010 | Premerlani | G01R 31/343 318/490 |
| 2010/0194324 | A1 * | 8/2010 | Kasztenny | G01R 31/34 318/490 |
| 2011/0080072 | A1 * | 4/2011 | Strobel | H02K 11/25 310/68 C |
| 2012/0232815 | A1 * | 9/2012 | Kang | G01R 21/133 702/61 |
| 2013/0080093 | A1 * | 3/2013 | Yang | G01R 21/133 702/60 |

OTHER PUBLICATIONS

GE Measurement & Control, "Motor Stator Insulation Monitor," GE Product Information manual Sep. 2013, 2 pages.
Neti, Prabhakar and Wilhelm, Brant, "Online Health Monitoring of Motor Insulation," 2013, 13 pages.
Whitefield, C. David, "New online motor Stator Insulation Monitor(MSIM) for 3500 System," Orbit vol. 32 No. 1 Jan. 2012, 4 pages.

* cited by examiner

SYSTEMS AND METHODS FOR MONITORING LEAKAGE CURRENT OF AN INDUSTRIAL MACHINE

The subject matter disclosed herein relates to industrial machines and, more specifically, to systems for monitoring leakage currents that may be associated with the industrial machines.

Certain synchronous and/or asynchronous machines such as electric motors and generators may experience leakage currents on the stator windings of the machines during operation. Specifically, because the stator windings may include metal windings in close proximity, the stator windings of the motor may be subject to inherent capacitance (e.g., capacitive current leakage). Electric machines may also experience leakage currents due to less than optimal or ineffective insulation protecting the stator windings (e.g., resistive current leakage). On the other hand, capacitive leakage is an inherent characteristic of a motor controlled primarily by design details. In any case, if leakage currents go undetected and/or are left to persist, the leakage currents may possibly contribute to damage (e.g., mechanical damage, thermal damage, and so forth) to the stator windings or other components of the electric motor. It may be desirable to provide methods to improve monitoring of leakage currents of electric motors or other synchronous and/or asynchronous machines.

BRIEF DESCRIPTION

Certain embodiments commensurate in scope with the originally claimed invention are summarized below. These embodiments are not intended to limit the scope of the claimed invention, but rather these embodiments are intended only to provide a brief summary of possible forms of the invention. Indeed, the invention may encompass a variety of forms that may be similar to or different from the embodiments set forth below.

In accordance with a first embodiment, a system includes a plurality of sensors configured to detect an electrical voltage and an electrical leakage current associated with an operation of an industrial machine, and a controller including a processor and a selection device. The selection device is configured to receive from the plurality of sensors a first input corresponding to the electrical voltage, and a second input corresponding to the electrical leakage current. The first input is paired together with the second input to generate a paired input. The selection device is configured to transmit an output to the processor based at least in part on the paired input. The output includes an indication of the electrical leakage current or a dissipation factor associated with the industrial machine.

In accordance with a second embodiment, a system includes a first sensor configured to obtain an electrical voltage measurement associated with an operation of an electrical industrial machine, a second sensor configured to obtain an electrical leakage current measurement associated with the electrical industrial machine; and a controller communicatively coupled to the first sensor and the second sensor. The controller includes a processor configured to receive a paired input corresponding to the electrical voltage measurement and the electrical leakage current measurement, receive a line frequency input corresponding to an operational frequency associated with at least one phase conductor electrically coupled to the electrical industrial machine, and to determine a dissipation factor associated with the at least one phase conductor of the electrical industrial machine based at least in part on the paired input and the line frequency input.

In accordance with a third embodiment, a system includes a plurality of sensors configured to obtain existing electrical line voltage and electrical leakage current measurements associated with stator windings of an alternating current (AC) motor and a controller. The controller includes a memory configured to store a historical record of electrical line voltage and electrical leakage current measurements associated with the stator windings of the AC motor over a time interval, and a processor configured to receive the existing electrical line voltage and electrical leakage current measurements and to determine a change of electrical leakage current or a change of dissipation factor associated with the stator windings of the AC motor by comparing the existing electrical line voltage and electrical leakage current measurements to the historical record of electrical line voltage and electrical leakage current measurements.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

Present embodiments relate to a control system useful for monitoring stator winding capacitive and/or resistive leakage currents, and for preventing these monitored leakage currents from contributing to damage (e.g., mechanical damage, thermal damage, and so forth) to the stator windings or other components of an electric motor or other synchronous and/or asynchronous machines. The control system may receive leakage current inputs via a number of high sensitivity current transformers (HSCTs), voltage inputs via a number of high voltage sensors (HVSs), and/or temperature inputs from temperature sensors, all of which may continuously (or selectively) monitor the stator windings. The present embodiments may also provide for improved processing and filtering techniques, which may allow for more efficient control and monitoring of the leakage currents on the stator windings of, for example, an electric motor. For example, in certain embodiments, the leakage current inputs and voltage inputs received by the control system may be paired together to offset certain variations (e.g., frequency harmonics, frequency and/or phase distortions, and so forth) that may be otherwise present in the received leakage current and voltage inputs. Similarly, in certain embodiments, the control system may include an internal memory (e.g., an on-site and/or on-board storage or database) that may be used to store a historical record of the operating parameters (e.g., leakage current inputs, voltage inputs, temperature inputs, and so forth), which may be utilized to provide for improved response time in detecting the leakage currents and performing control actions to preclude the possibly damaging effects of the leakage currents. The control system may also directly receive the input line frequency of the stator windings, which may be used as an indicator in determining the presence of leakage currents.

Figure 1:
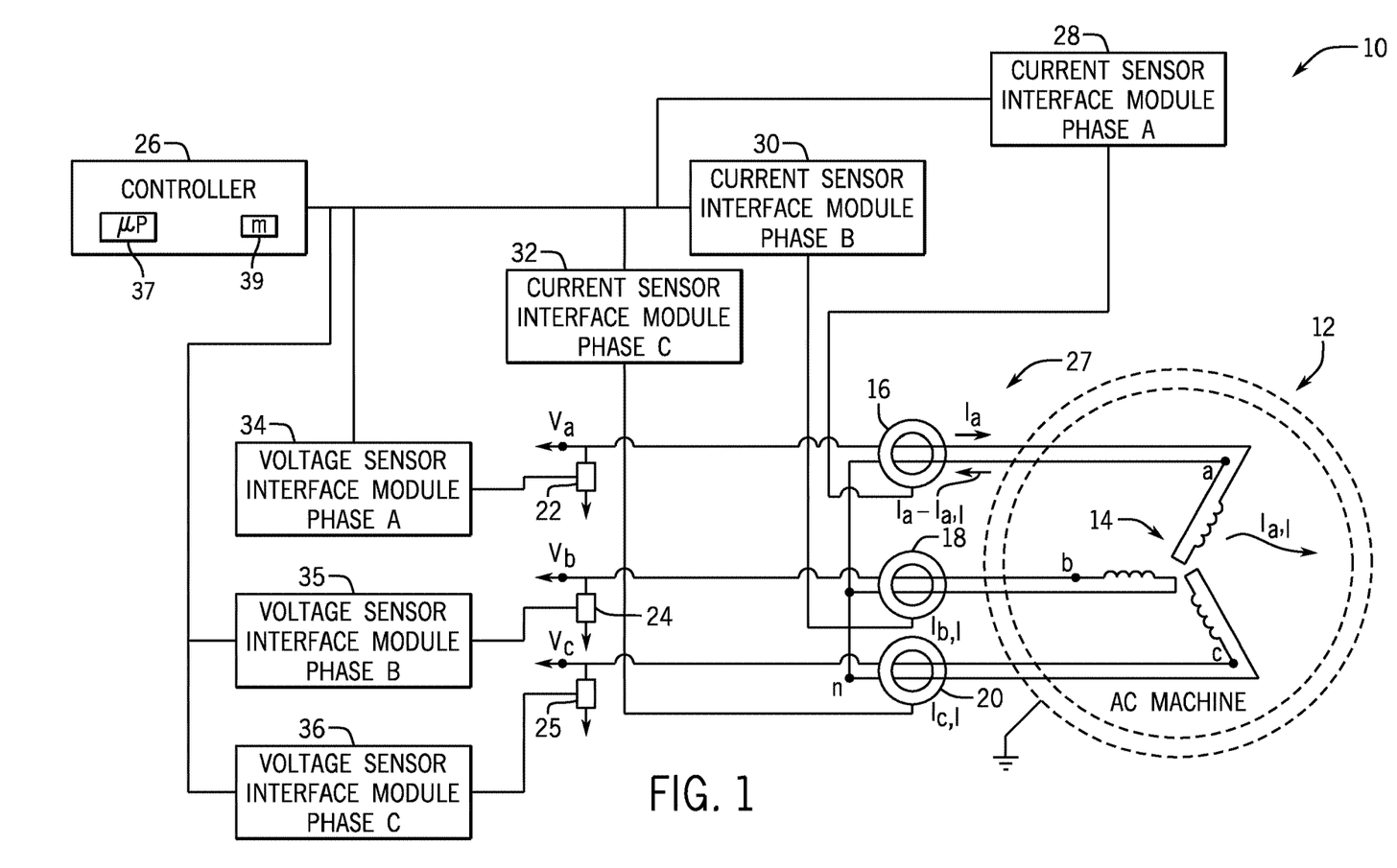
FIG. 1 is a block diagram of an embodiment of a industrial machine and control system including a controller, in accordance with present embodiments.

With the foregoing in mind, it may be useful to describe an industrial machine and control system, such as an example industrial machine and control system 10 illustrated in FIG. 1. As depicted, the system 10 may include an industrial machine 12 including a number of stator windings 14, a number of leakage current sensors 16, 18, and 20, and a number of voltage sensors 22, 24, and 25 all communicatively coupled to a controller 26. The industrial machine 12 may be any single or multi-phase synchronous and/or asynchronous machine useful in converting an electrical power input into a mechanical output to drive another system or device. For example, in certain embodiments, the industrial machine 12 may be a single or multi-phase electric motor, or in other embodiments, a generator. Thus, as illustrated, the industrial machine 12 may include the stator windings 14. As it may be appreciated, the stator windings 14 may include single or multi-phase conductors (e.g., phases a, b, c) that may be coiled around an iron magnetic core to form magnetic poles when energized with an electrical current. Although not illustrated, it should be appreciated that the magnetic field generated by the windings of the stator windings 14 may rotate a drive shaft.

As previously noted, a number of leakage current sensors 16, 18, and 20 may be communicatively coupled to each of three-phases (e.g., phases a, b, c) of the stator windings 14, and by extension, the machine 12. In certain embodiments, the leakage current sensors 16, 18, and 20 may include, for example, high sensitivity current transformers (HSCTs), other current transformers (CTs), or any devices that output a signal (e.g., AC/DC voltage or current) proportional to a detected electrical current flowing through the electrically and/or communicatively coupled phase conductors 27. As also illustrated, a number of voltage sensors 22, 24, and 25 may be communicatively coupled to each of the three-phases (e.g., phases a, b, c) of the stator windings 14, and by extension, the machine 12. The voltage sensors 22, 24, and 25 may include, for example, any of various high voltage sensors (HVSs) (e.g., high voltage dividers) useful in producing a voltage proportional to a detected voltage on the three-phase conductors 27.

In certain embodiments, the leakage current sensors 16, 18, and 20 may be communicatively coupled to corresponding leakage current sensor interface modules 28, 30, and 32 corresponding to each of the three-phase conductors 27 (e.g., phases a, b, c) of the stator windings 14. The leakage current sensor interface modules 28, 30, and 32 may be useful in processing the outputs of the leakage current sensors 16, 18, and 20 (e.g., on-site), and subsequently delivering the leakage current sensor outputs to the controller 26. Similarly, the voltage sensors 22, 24, and 25 may be communicatively coupled to corresponding voltage sensor interface modules 34, 35, and 36 corresponding to the three-phase conductors 27 (e.g., phases a, b, c) of the stator windings 14. The voltage sensor interface modules 34, 35, and 36 may be useful in processing the outputs of the voltage sensors 22, 24, and 25 (e.g., on-site), and subsequently delivering the voltage sensor outputs to the controller 26.

In certain embodiments, the controller 26 may be suitable for generating and implementing various control algorithms and techniques to control the current and/or voltage of the stator windings 14, and by extension, the output (e.g., speed, torque, frequency, and so forth) of the machine 12. The controller 26 may also provide an operator interface through which an engineer or technician may monitor the components of the system 10 such as, components (e.g., leakage current sensors 16, 18, and 20 and voltage sensors 22, 24, and 25) of the machine 12. Accordingly, as will be further appreciated, the controller 26 may include one or more processors 37 that may be used in processing readable and executable computer instructions, and a memory 39 that may be used to store the readable and executable computer instructions and other data. These instructions may be encoded in programs stored in tangible non-transitory computer-readable medium such as the memory 39 and/or other storage of the controller 26. Furthermore, the one or more processors 37 and memory 39 may allow the controller 26 to be programmably retrofitted with the instructions to carry out one or more of the presently disclosed techniques without the need to include, for example, additional hardware components.

In certain embodiments, the controller 26 may also host various industrial control software, such as a human-machine interface (HMI) software, a manufacturing execution system (MES), a distributed control system (DCS), and/or a supervisor control and data acquisition (SCADA) system. For example, in one embodiment, the controller 26 may be a Motor Stator Insulation Monitor (MSIM)™ available from General Electric Co., of Schenectady, N.Y. Thus, the control system may be a standalone control system, or one of several control and/or monitoring systems useful in monitoring and regulating the various operating parameters of the machine 12. As will be further appreciated, the controller 26 may be used to monitor leakage currents $I_{a,l}$, $I_{b,l}$, and $I_{c,l}$ and/or dissipation factor (DF) that may be associated with the three-phase (e.g., phases a, b, c) stator windings 14. Specifically, leakage currents $I_{a,l}$, $I_{b,l}$, and $I_{c,l}$ may appear in one or more phases of the stator windings 14 in the forms of capacitive leakage currents or resistive leakage currents. The total leakage current (e.g., the sum the capacitive leakage currents and the resistive leakage currents) may possibly cause mechanical damage or thermal damage to the stator windings 14 if left to persist.

Figure 2:
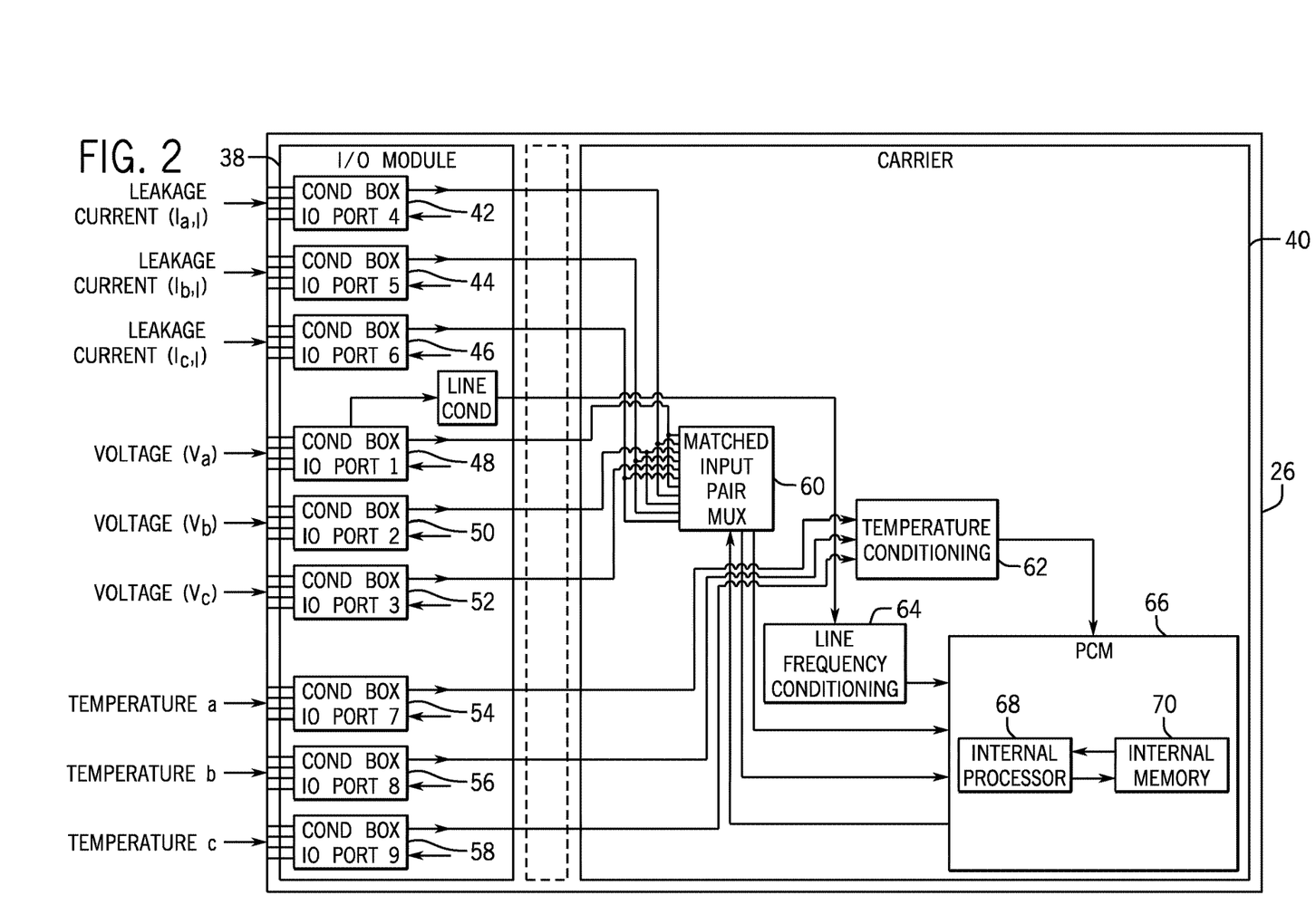
FIG. 2 is a block diagram of an embodiment of the controller of FIG. 1 including an I/O module and a carrier module, in accordance with present embodiments.

Turning now to FIG. 2, a block diagram of an embodiment of the controller 26 is illustrated. As depicted, the controller 26 may include an input-output (I/O) module 38 and a carrier module 40. In certain embodiments, the I/O module 38 may include a number of current I/O ports 42, 44, and 46 (e.g., for receiving the outputs of the leakage current sensors 16, 18, and 20 from the leakage current sensor interface modules 28, 30, and 32), a number of voltage I/O ports 48, 50, and 52 (e.g., for receiving the outputs of the voltage sensors 22, 24, and 25 from the voltage sensor interface modules 34, 35, and 36), and a number of temperature I/O ports 54, 56, and 58. Temperature outputs may be received from one or more resistance temperature detectors (RTDs), thermocouples, or other temperature sensors that may be communicatively coupled to the stator windings 14 for detecting the temperature associated with the stator windings 14.

As further depicted by FIG. 2, the three-phase leakage current signals (e.g., leakage current $I_{a,l}$, leakage current $I_{b,l}$, and leakage current $I_{c,l}$), three-phase voltage signals (e.g., voltage $V_a$, voltage $V_b$, and voltage $V_c$), and temperature signals (e.g., temperature$_a$, temperature$_b$, and temperature$_c$) may be transmitted to the carrier module 40. As previously noted, the three-phase current signals, voltage signals, and temperature signals may be used by the controller 26 to detect capacitive and resistive leakage currents of the stator (e.g., $I_{a,l}$, $I_{b,l}$, $I_{c,l}$) and/or a change in dissipation factor that may become present on one or more phases of the stator windings 14 of the machine 12. In certain embodiments, the carrier module 40 may include various configurations useful in facilitating the processing and/or filtering of the three-phase current signals, voltage signals, and temperature signals received at the respective I/O ports 42-58 of the I/O module 38.

For example, in certain embodiments, the carrier module 40 may include a matched input pair multiplexer (mux) block 60. The matched input pair mux block 60 may be any circuitry (e.g., hardware) or other system (e.g., software system or data selector) useful in selecting between a number of analog and/or digital input signals (e.g., current signals, voltage signals, and temperature signals) and outputting the selected signals. Specifically, in certain embodiments, as discussed herein, the matched input pair mux block 60 may be used to match or pair each current signal (e.g., leakage currents $I_{a,l}$, $I_{b,l}$, and $I_{c,l}$) with the corresponding the voltage signal (e.g., voltage $V_a$, voltage $V_b$, and voltage $V_c$) for each of the three phases of the stator windings 14 of the machine 12. For example, as illustrated in FIG. 2, leakage current $I_{a,l}$ received at the I/O port 42 may be matched and/or paired with the corresponding phase voltage $V_a$ received at the I/O port 48. Similarly, the leakage current $I_{b,l}$ received at the I/O port 44 may be matched and/or paired with the corresponding phase voltage $V_b$ received at the I/O port 50, and so forth. Specifically, because the current and the voltage of each phase of the stator windings 14, for example, may be interdependent, pairing the current and voltage inputs may offset any variations (e.g., frequency harmonics, frequency and/or phase distortions, and so forth) in the current and voltage signals. In this manner, the controller 26 may detect leakage currents and/or variations in dissipation factor on the stator windings 14 of the machine 12 with a higher degree of certainty since variations that may otherwise be present between the current inputs and the voltage inputs may be substantially reduced. Thus, any significant variations in the operating currents and/or voltages on one or more phases of the stator windings 14 may be indicative of leakage currents (e.g., capacitive and/or resistive leakage currents) and/or change in dissipation factor.

In certain embodiments, at least one of the three voltage phases (e.g., phase voltage $V_a$) may be input directly to a line frequency conditioning block 64, while the temperature signals (e.g., temperature$_a$, temperature$_b$, and temperature$_c$) may be input to a temperature conditioning block 62 to condition temperature signals for performing temperature compensation in the PCM 66. The line frequency conditioning block 64 may be a hardware system (e.g., microcontroller or other processor), software system, or any combination thereof, useful in detecting the line frequency or input frequency (e.g., 50-60 Hz or similar frequency rating) of one or more of the three-phase conductors 27 (e.g., phases a, b, and c). Specifically, as illustrated in FIG. 2, the three-phase voltage signal $V_a$, for example, may be sampled directly to determine input frequency and/or phase, which may provide further indication of leakage currents (e.g., capacitive and/or resistive leakage currents) and/or dissipation factor on the stator windings 14 of the machine 12. In particular, by filtering the direct input line frequency received at the line frequency conditioning block 64, the controller 26 may be able to determine input line frequency more accurately and provide for improved response time that may be otherwise unavailable using less advanced techniques such as a phase lock loop (PLL).

In certain embodiments, the matched input pair mux block 60 and the line frequency conditioning block 64 may transmit the paired leakage current and voltage output signals and the input line frequency to a sensor portable core module (PCM) 66 for processing and routing. The PCM 66 may include an internal processor 68 and an internal memory 70. The internal processor 68 may be a general purpose processor, system-on-chip (SoC) device, or some other processor configuration that may be useful in sampling and/or calculating the three-phase current signals (e.g., leakage current $I_{a,l}$, leakage current $I_{b,l}$, and leakage current $I_{c,l}$), three-phase voltage signals (e.g., voltage $V_a$, voltage $V_b$, and voltage $V_c$), and temperature signals (e.g., temperature$_a$, temperature$_b$, and temperature$_c$) transmitted to the carrier module 40. In certain embodiments, the internal memory 70 may be an on-board memory among other memory devices that may be included within the controller 26. Specifically, the internal memory 70 may be used to store a historical record of data collected for detecting leakage currents (e.g., capacitive and/or resistive leakage currents) and/or dissipation factor on the stator windings 14 of the machine 12.

In certain embodiments, the internal processor 68 of the controller 26 may use the historical data stored by the internal memory 70 to perform probabilistic and statistical techniques such as regression analysis (e.g., linear regression, non-linear regression, ridge regression), data mining, trend estimation, and/or other similar techniques to measure trends in the three-phase current signals (e.g., leakage current $I_{a,l}$, leakage current $I_{b,l}$, and leakage current $I_{c,l}$), three-phase voltage signals (e.g., voltage $V_a$, voltage $V_b$, and voltage $V_c$), and temperature signals (e.g., temperature$_a$, temperature$_b$, and temperature$_c$). In some embodiments, the controller 26, for example, via the internal processor 68, may compare the three-phase current signals (e.g., leakage current $I_{a,l}$, leakage current $I_{b,l}$, and leakage current $I_{c,l}$) to the historical data (e.g., leakage current measurements) collected over some time interval (e.g., less than approximately 1 day, less than approximately 1 week, less than approximately 1 month, less than approximately 1 year, less than approximately 2 years, less than approximately 5 years, less than approximately 10 years, less than approximately 20 years, less than approximately 30 years, or less than approximately 35 years). In certain embodiments, the time interval may be fixed or user-configurable, and thus may be adjusted, for example, by an operator or engineer. It should be appreciated that the historical comparisons may be executed directly in the controller 26 since the historical measurement data may be stored to, for example, the internal memory 70. Specifically, by providing the internal memory 70 (e.g., on-board memory and/or on-site storage or database), the internal processor 68 may access the historical data more quickly and determine faults, leakage currents (e.g., capacitive and/or resistive leakage currents), dissipation factor, and/or other anomalies more efficiently, thus allowing the controller 26 to respond to such faults or detections of leakage currents associated with substantially improved response times.

Figure 3:
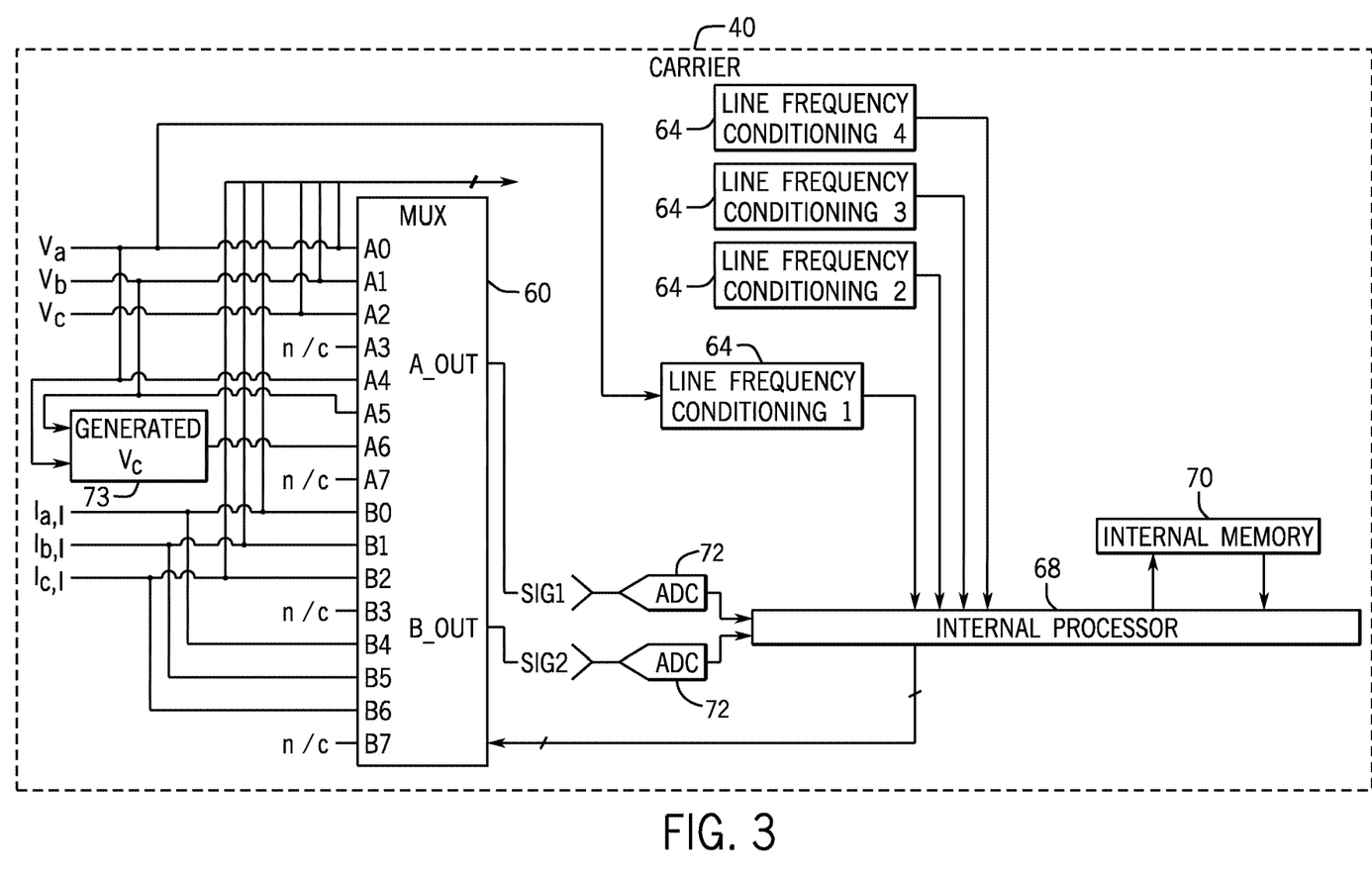
FIG. 3 is a detailed block diagram of the carrier module of the controller of FIG. 1, in accordance with present embodiments.

Turning now to FIG. 3, which provides a more detailed illustration of the carrier module 40. As depicted, the matched input pair mux block 60 (also illustrated in FIG. 2) may include input pins A0-A7 and B0-B7 for receiving the paired voltage signals (e.g., voltage $V_a$, voltage $V_b$, and voltage $V_c$) and current signals (e.g., leakage current $I_{a,l}$, leakage current $I_{b,l}$, and leakage current $I_{c,l}$). As further illustrated, and also previously noted with respect to FIG. 2, the paired voltage signals and leakage current signals may be output via output pins A_OUT and B_OUT to analog-to-digital converters (ADCs) 72, and then to the internal processor 68 for processing and further routing. In certain embodiments, one of the phase voltages (e.g., $V_c$) may be calculated based on the phase voltages $V_a$ and $V_b$. For example, should the machine 12 be configured in a three-phase balanced configuration, the phase voltages $V_a$, $V_b$, and $V_c$, may generally be of equal magnitude separated by a phase difference of approximately 120°. Thus, the phase voltage $V_c$ may be calculated via generated $V_c$-block 73 based on the inputs of the phase voltage $V_a$ and $V_b$ inputs. In other embodiments, phase voltage $V_c$ may be calculated by computing a vector sum of the phase voltages $V_a$ and $V_b$. In this way, the controller 26 may determine the phase voltages $V_a$, $V_b$, and $V_c$ using, for example, only two actual voltage sensors 22 and 24 (e.g., as opposed to one voltage sensor 22, 24, and 25 for each phase), which may contribute to reduced system complexity. In other embodiments, methods to process the voltage and leakage current signals may include using one line voltage signal (e.g., $V_a$) and adding phase adjustments associated with each current signal (e.g., leakage current $I_{a,l}$, leakage current $I_{b,l}$, and leakage current $I_{c,l}$). Yet still, in another embodiment, a method to process the voltage and leakage current signals may include capturing each signal and performing one or more post processing techniques according to any user-desired configuration and/or combination.

In certain embodiments, as further illustrated in FIG. 3, additional line frequency conditioning blocks 64 may be provided to the internal processor 68. The additional line frequency conditioning blocks 64 may be based on the current signals (e.g., leakage current $I_{a,l}$, leakage current $I_{b,l}$, and leakage current $I_{c,l}$) and voltage signals (e.g., voltage $V_a$, voltage $V_b$, and voltage $V_c$). As noted above with respect to FIG. 2, the controller 26 may perform stator winding capacitive and resistive leakage current measurements by calculating the phase and magnitude of leakage current (e.g., $I_{a,l}$), which may be derived by the internal processor 68 based on the direct input line frequency inputs received by way of the line frequency conditioning blocks 64.

Figure 4:
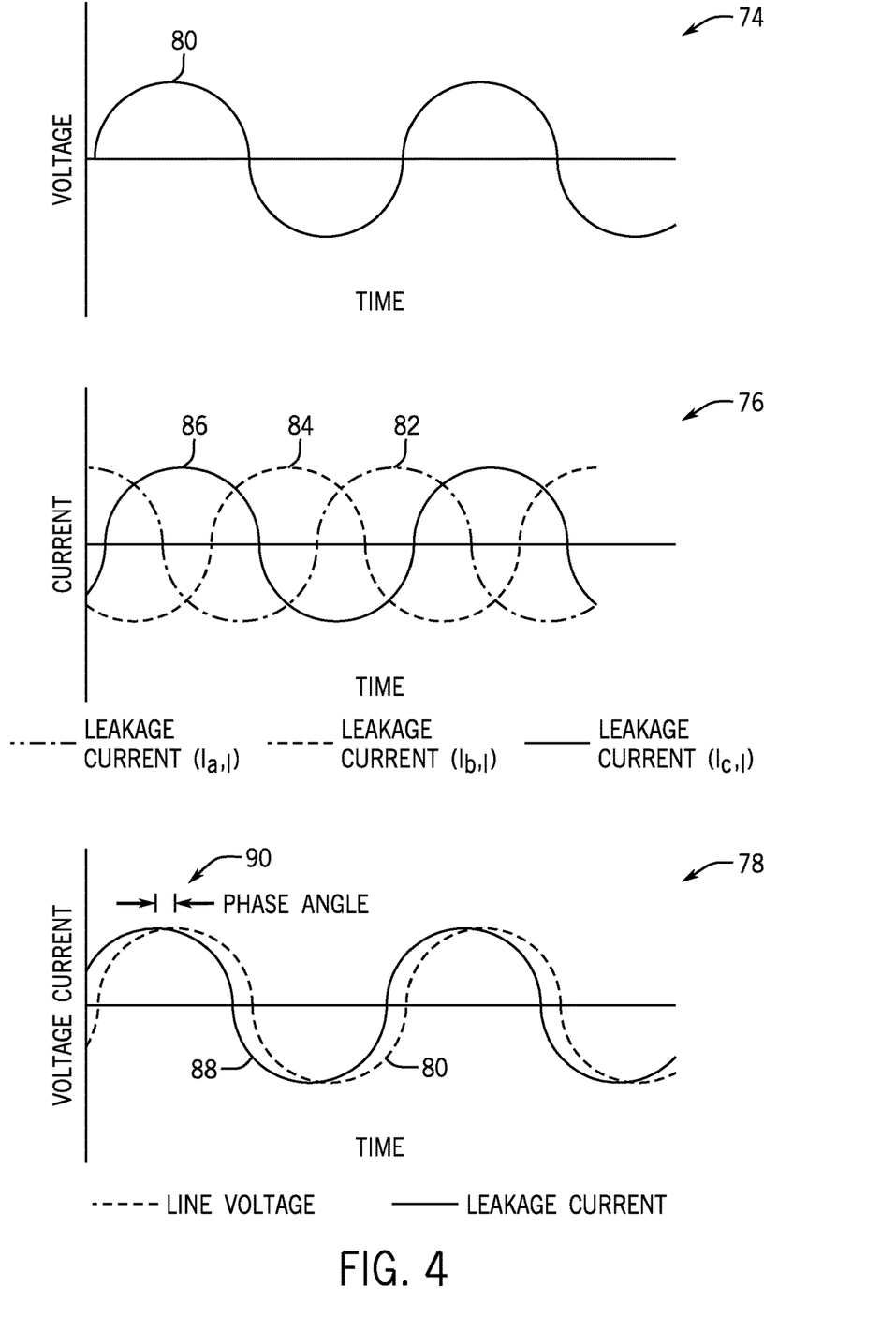
FIG. 4 is a series of plot diagrams illustrating detectable electrical voltage and electrical leakage current signals associated with the industrial machine of FIG. 1, in accordance with present embodiments.

As an example illustration, FIG. 4 depicts a voltage input plot 74 (e.g., AC voltage signal 80), a three-phase current input plot 76 (e.g., leakage current signals 82, 84, and 86), and a leakage current-voltage (I-V) plot 78 (e.g., AC voltage signal 80 and leakage current signal 88). It should be appreciated that the voltage signal 80 of plot 74 may be a representation of one of the phase voltages $V_a$, $V_b$, and $V_c$. Similarly, the total leakage current signal 88 of plot 78 may be a representation of one of the leakage currents $I_{a,l}$, $I_{b,l}$, and $I_{c,l}$ of plot 76. The plot 78 illustrates the phase angle 90 between the voltage input signal 80 and the leakage current input signal 88. The phase angle 90 may be used to derive the capacitive and/or resistive leakage currents that may be present on the stator windings 14 of the machine 12. As previously noted, in this way, the controller 26 may be able to determine input line frequency and/or phase more accurately and improve response time, all of which may be otherwise unavailable using a phase lock loop (PLL).

Technical effects of the present embodiments relate to a control system useful for monitoring stator winding capacitive and resistive leakage currents and to prevent the leakage currents from contributing to damage (e.g., mechanical damage, thermal damage, and so forth) to the stator windings or other components of an electric motor or other synchronous and/or asynchronous machines. The control system may receive leakage current inputs via a number of high sensitivity current transformers (HSCTs), voltage inputs via a number of high voltage sensors (HVSs), and temperature inputs from temperature sensors, all of which monitor the stator windings. The present embodiments may also provide for improved processing and filtering techniques, and thus more efficient control and monitoring of the leakage currents of the stator windings of, for example, an electric motor. For example, in certain embodiments, the leakage current inputs and voltage inputs may be paired together to offset certain variations (e.g., frequency harmonics, frequency and/or phase distortions, and so forth) that may be otherwise present in the leakage current and voltage inputs. Similarly, in certain embodiments, the control system may include an internal memory (e.g., an on-site and/or on-board storage or database) that be used to store a historical record of the operating parameters (e.g., leakage current, voltage, temperature, and so forth), which may provide for improved response time in detecting the leakage currents and performing control actions to preclude possibly damaging effects of the leakage currents. The control system may also directly receive the input line frequency of the stator windings, which may be used to calculate leakage current measurements.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A system, comprising:
a plurality of voltage sensors each configured to detect an electrical voltage of a plurality of electrical voltages from an industrial machine;

a plurality of current sensors each configured to detect an electrical leakage current of a plurality of electrical leakage currents from the industrial machine;

one or more temperature sensors communicatively coupled to respective stator windings of the industrial machine, wherein each of the temperature sensors is configured to detect a temperature associated with its respective stator winding and to output one or more temperature signals representing respective detected temperatures; and a controller comprising:
  a processor;
  a multiplexer configured to:
    receive the plurality of electrical voltages, and the plurality of electrical leakage currents;
    pair a first electrical voltage of the plurality of electrical voltages with a first electrical leakage current to offset frequency harmonics, frequency distortions, phase distortions, or a combination thereof, and output the first electrical voltage and the first electrical leakage current via respective first and second output pins of the multiplexer;
  a first analog to digital converter configured to receive the first electrical voltage via the first output pin and directly output a digitized first electrical voltage to the processor;
  a second analog to digital converter configured to receive the first electrical leakage current via the second pin and directly output a digitized first electrical leakage current to the processor;
  a first plurality of frequency conditioning blocks configured to detect a voltage line frequency from each of the plurality of the plurality of electrical voltages from the industrial machine and directly output each of the plurality of voltage line frequencies to the processor; and
  a second plurality of frequency conditioning blocks configured to detect a current line frequency from each of the plurality of the plurality of electrical leakage currents from the industrial machine and directly output each of the plurality of current line frequencies to the processor;

wherein the processor is configured to receive the one or more temperature signals and to determine a fault in the industrial machine based upon the received digitized first electrical voltage, the digitized first electrical leakage, and the one or more temperature signals.

2. The system of claim 1, wherein the industrial machine comprises a synchronous motor, an induction motor, or a generator.

3. The system of claim 1, wherein a current sensor of the plurality of current sensors comprises a high sensitivity current transformer (HSCT), wherein a voltage sensor of the plurality of voltage sensors comprises a high voltage sensor (HVS).

4. The system of claim 1, wherein the multiplexer is configured to receive an electrical voltage of a first phase conductor of multiple phase conductors electrically coupled to the industrial machine and an electrical leakage current of the first phase conductor.

5. The system of claim 1, wherein the controller is configured to calculate an electrical dissipation factor of the industrial machine.

6. The system of claim 1, wherein the processor is configured to detect harmonics generated by the one or more electrical voltage input signals and the one or more electrical leakage current input signals based on the voltage line frequency inputs and the current line frequency inputs.

* * * * *